(12) United States Patent  
Lin

(10) Patent No.: US 9,054,483 B2  
(45) Date of Patent: Jun. 9, 2015

(54) PHOTOELECTRIC CONVERTING MODULE

(71) Applicant: HON HAI PRECISION INDUSTRY CO., LTD., New Taipei (TW)

(72) Inventor: I-Thun Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 120 days.

(21) Appl. No.: 13/747,393

(22) Filed: Jan. 22, 2013

(65) Prior Publication Data

US 2014/0146843 A1    May 29, 2014

(30) Foreign Application Priority Data

Nov. 27, 2012    (TW) .................................. 101144386

(51) Int. Cl.
| | |
|---|---|
| *G02B 6/36* | (2006.01) |
| *G02B 6/42* | (2006.01) |
| *H01S 5/022* | (2006.01) |
| *H05K 3/30* | (2006.01) |

(52) U.S. Cl.
CPC ........... *H01S 5/02284* (2013.01); *G02B 6/4204* (2013.01); *G02B 6/4214* (2013.01); *G02B 6/4262* (2013.01); *G02B 6/4292* (2013.01); *G02B 6/4239* (2013.01); *G02B 6/4219* (2013.01); *H01S 5/02288* (2013.01); *H05K 3/303* (2013.01); *H05K 2201/10121* (2013.01); *H05K 2201/2018* (2013.01); *H05K 2201/2027* (2013.01)

(58) Field of Classification Search
CPC .. G02B 6/4201; G02B 6/4204; G02B 6/4214; G02B 6/4219; G02B 6/4228; G02B 6/4292; G02B 6/423; G02B 6/4236; G02B 6/4239; G02B 6/4251; G02B 6/4256; G02B 6/426; G02B 6/4262; H01S 5/02208; H01S 5/02284; H01S 5/02288; H01S 5/02292; H05K 2201/10121; H05K 2201/2018; H05K 2201/2027; H05K 3/303
USPC .................. 385/14, 74–78, 88–94; 372/50.23
See application file for complete search history.

(56) References Cited

U.S. PATENT DOCUMENTS

2008/0232737 A1*    9/2008    Ishigami et al. ................ 385/14

* cited by examiner

*Primary Examiner* — Akm Enayet Ullah  
*Assistant Examiner* — Michael Mooney  
(74) *Attorney, Agent, or Firm* — Novak Druce Connolly Bove + Quigg LLP

(57) ABSTRACT

A photoelectric converting module includes a circuit board, a locating frame fixed on the circuit board, and a photoelectric coupling element. The photoelectric coupling element includes a bottom surface. The bottom surface defines a groove. A shape of the groove coincides with that of the locating frame and a size of the groove is slightly greater than that of the locating frame. The groove receives the locating frame.

6 Claims, 4 Drawing Sheets

PHOTOELECTRIC CONVERTING MODULE

BACKGROUND

1. Technical Field

The present disclosure relates to a photoelectric converting module.

2. Description of Related Art

A photoelectric converting module usually includes a circuit board, a photoelectric component carried on the circuit board, and a photoelectric coupling element fixed on the circuit board. The photoelectric coupling element usually includes a coupling lens aligned with the photoelectric component. Yet, it is difficult to align the coupling lens with the photoelectric component during assembly.

Therefore, it is desired to provide a photoelectric converting module which can overcome the above mentioned problems.

DETAILED DESCRIPTION

Figure 1:
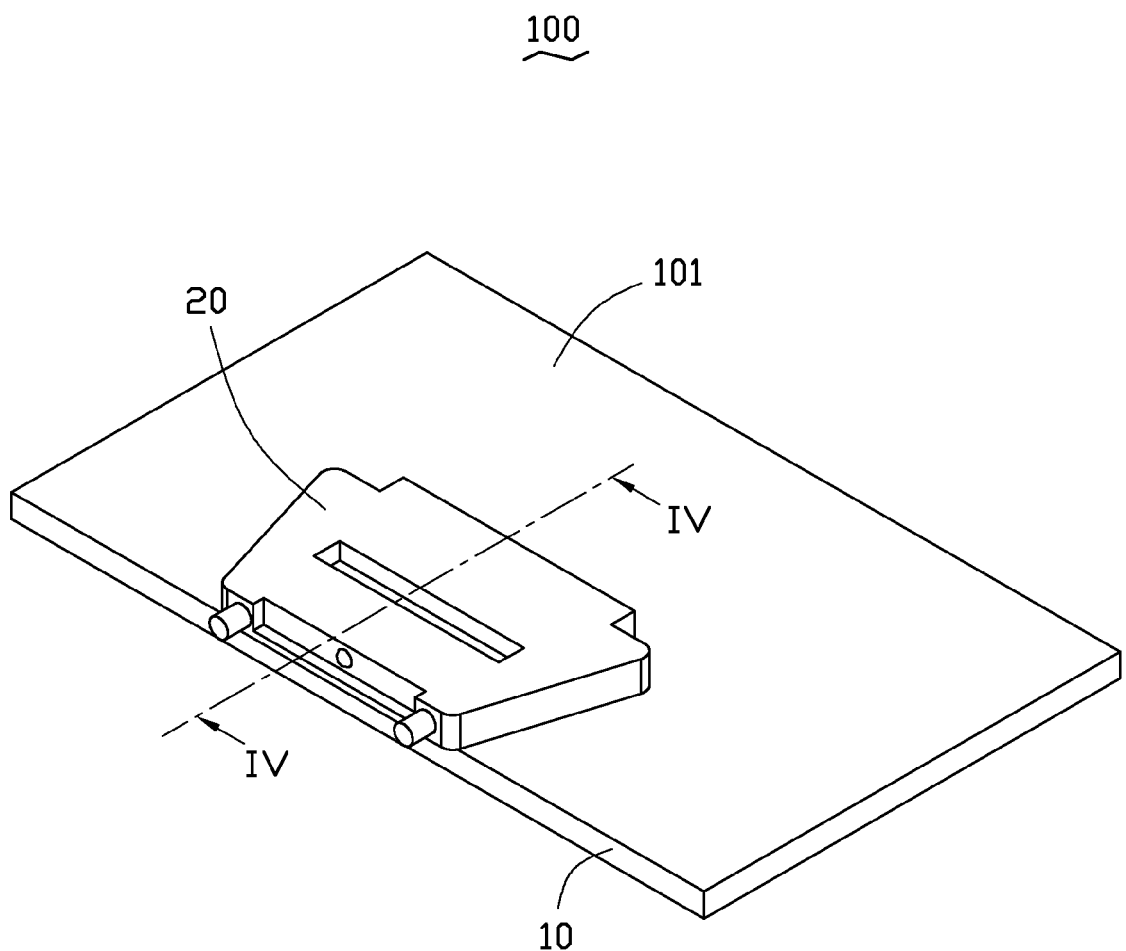
FIG. 1 is a schematic, isometric view of a photoelectric converting module according to an exemplary embodiment, the photoelectric converting module including a photoelectric coupling element.
Figure 2:
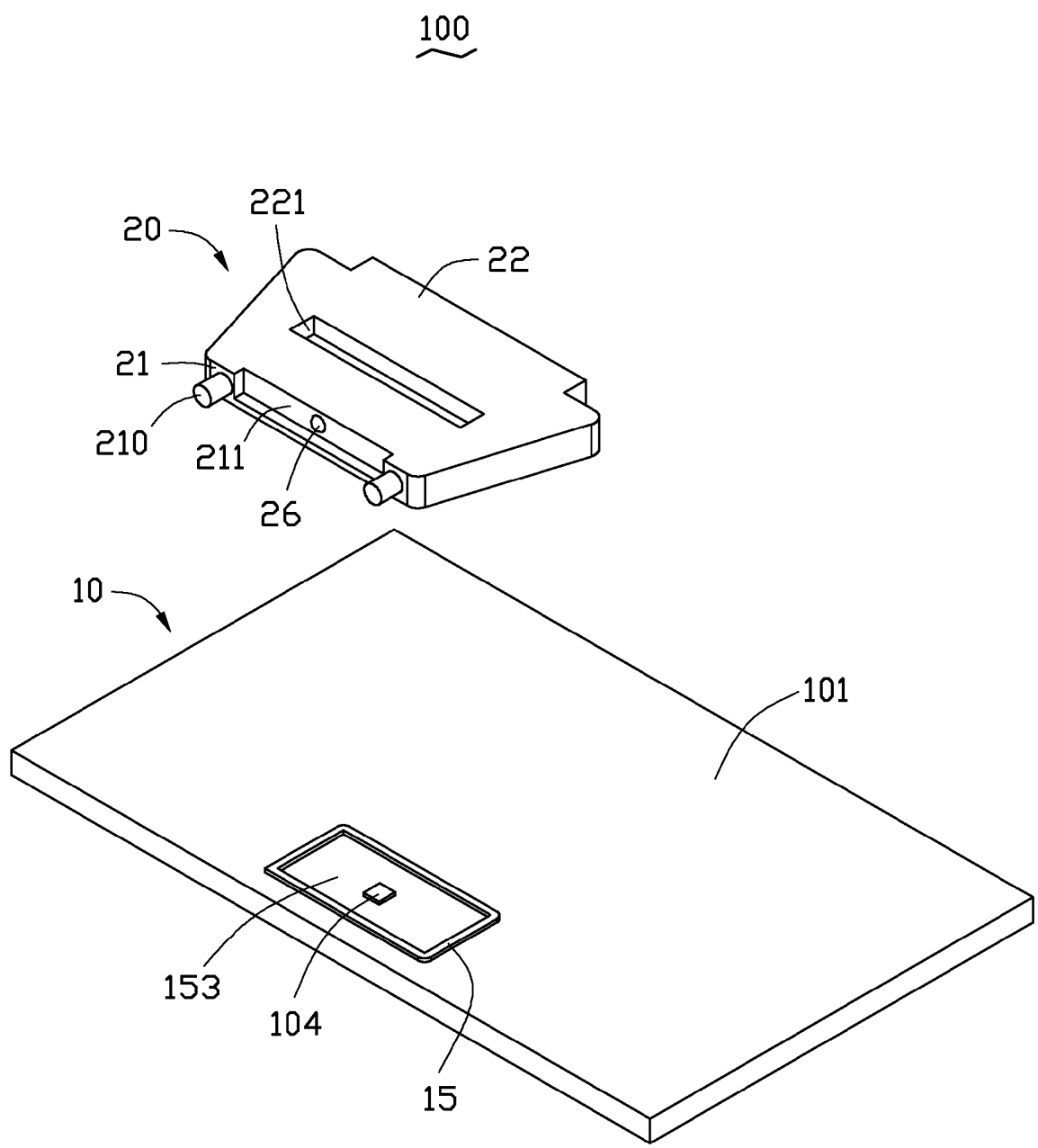
FIG. 2 is an exploded view of the photoelectric converting module of FIG. 1.
Figure 3:
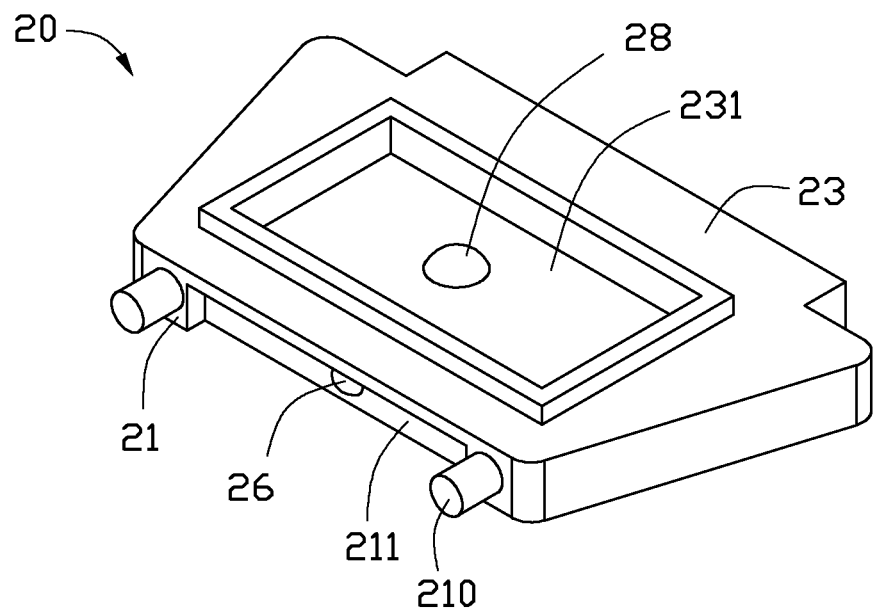
FIG. 3 is a schematic, isometric view of the photoelectric coupling element of FIG. 1.
Figure 4:
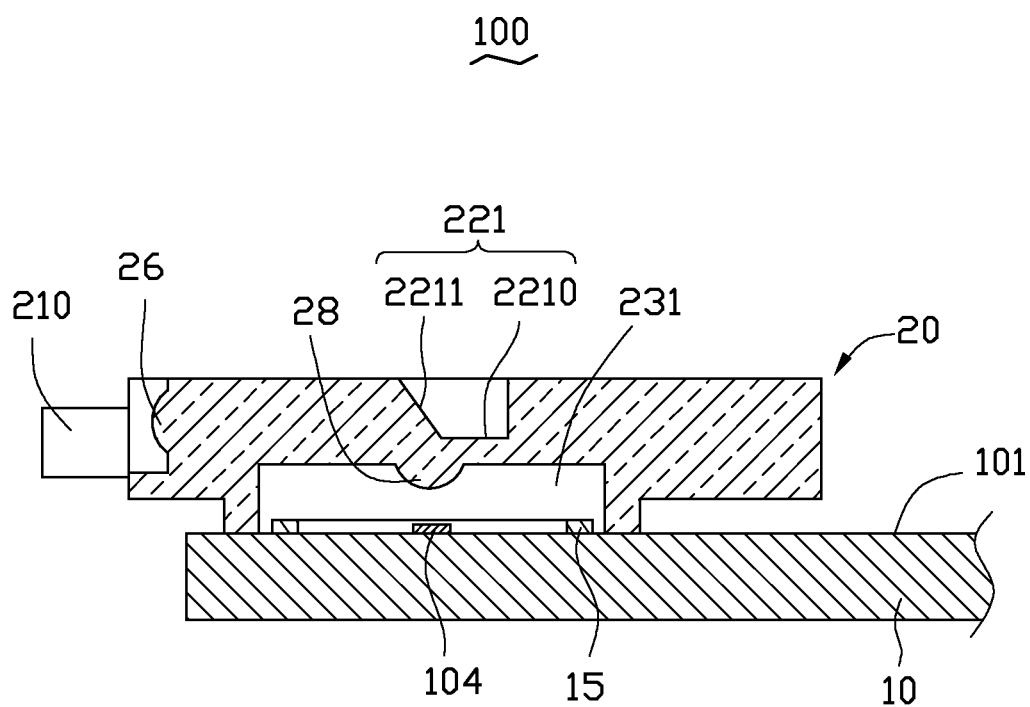
FIG. 4 is a cross-sectional view taken along IV-IV line of the photoelectric converting module of FIG. 1.

FIGS. 1 to 4 show a photoelectric converting module 100. The photoelectric converting module 100 includes a circuit board 10, a locating frame 15 and a photoelectric coupling element 20.

The circuit board 10 includes a loading surface 101. The loading surface 101 carries a photoelectric component 104. The photoelectric component 104 is an optical emitting component, such as a laser diode.

The locating frame 15 is substantially rectangular, and defines an opening 153. The locating frame 15 is fixed on the loading surface 101. The photoelectric component 104 is received in the opening 153. In this embodiment, the locating frame 15 and the circuit board 10 are integrally formed.

The photoelectric coupling element 20 includes an end surface 21, an upper surface 22, and a bottom surface 23 opposite to the upper surface 22. The upper surface 22 is parallel to the bottom surface 23. The end surface 21 is perpendicularly connected to the upper surface 22 and the bottom surface 23 respectively.

The bottom surface 23 is a stepped surface and defines a first groove 231. The shape of the first groove 231 coincides with that of the locating frame 15 and the size of the first groove 231 is slightly greater than that of the locating frame 15. The photoelectric coupling element 20 includes a first coupling lens 28 in the first groove 231. The first coupling lens 28 spatially corresponds to the photoelectric component 104 and is a convex lens in this embodiment.

The upper surface 22 defines a second groove 221. The second groove 221 includes a first inner surface 2210 and a second inner surface 2211. The first inner surface 2210 is parallel to the upper surface 22. The second inner surface 2211 is inclined relative to the first inner surface 2210. An included angle between the first inner surface 2210 and the second inner surface 2211 is about 45 degrees. An optical axis of the first coupling lens 28 is perpendicular to the first inner surface 2210. An included angle between the optical axis of the first coupling lens 28 and the second inner surface 2211 is about 45 degrees.

A pair of locating rods 210 are formed on the end surface 21. The end surface 21 further defines a slot 211. The photoelectric coupling element 20 further includes a second coupling lens 26 in the slot 211. The second coupling lens 26 is aligned with an optical fiber (not shown). In this embodiment, the second coupling lens is a convex lens.

In assembly, the photoelectric coupling element 20 is put on the loading surface 101 of the circuit board 10. The locating frame 15 is fit in the first groove 231 to approximately align the first coupling lens 28 with the photoelectric component 104. Then the photoelectric coupling element 20 is moved slightly to align the first coupling lens 28 with the photoelectric component 104 precisely. At last, glue is dispersed between a peripheral portion of the photoelectric coupling element 20 and the circuit board 10 to fix the photoelectric coupling element 20 on the circuit board 10.

The locating frame 15 and the first groove 231 are used to align the photoelectric component 104 and the first coupling lens 28 approximately. In this way, an assembling time is reduced. Furthermore, the locating frame 15 can prevent the glue from polluting the photoelectric component 104.

When in use, optical signals emitted by the photoelectric component 104 are directed to the second inner surface 2211 by the first coupling lens 28. The second inner surface 2211 reflects the optical signals to the second coupling lens 26. The second coupling lens 26 directs the optical signals to the optical fiber.

It is to be understood, however, that even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A photoelectric converting module, comprising:
a circuit board comprising a loading surface;
a locating frame fixed on the loading surface, projected from the loading surface, and defining an opening fully surrounded by the locating frame;
a photoelectric component positioned in the opening and carried on the loading surface; and
a photoelectric coupling element comprising a bottom surface, the bottom surface defining a first groove, a shape of the first groove coinciding with a shape of the locating frame, a size of the first groove slightly greater than a size of the locating frame, the first groove receiving the locating frame.

2. The photoelectric converting module of claim 1, wherein the photoelectric coupling element comprises a first coupling lens in the first groove, and the first coupling lens is aligned with the photoelectric component.

3. The photoelectric converting module of claim 2, wherein the photoelectric coupling element further comprises an end surface, an upper surface and a pair of locating rods on the end surface, the upper surface is parallel to the bottom surface, the end surface is perpendicularly connected to the upper surface and the bottom surface.

4. The photoelectric converting module of claim 3, wherein the end surface defines a slot, and the photoelectric coupling element further comprises a second coupling lens in the slot.

5. The photoelectric converting module of claim 4, wherein the upper surface defines a second groove, the second groove comprises a first inner surface and a second inner surface, the first inner surface is parallel to the upper surface, an included angle between the first inner surface and the second inner surface is about 45 degrees, an optical axis of the first coupling lens is perpendicular to the first inner surface.

6. The photoelectric converting module of claim 5, wherein an included angle between an optical axis of the second coupling lens and the second inner surface is about 45 degrees.

* * * * *